United States Patent
Nho et al.

(10) Patent No.: US 8,395,601 B2
(45) Date of Patent: Mar. 12, 2013

(54) TOUCH SENSING SYSTEM AND DISPLAY APPARATUS EMPLOYING THE SAME

(75) Inventors: Jeong-ho Nho, Suwon-si (KR); Yong-dok Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 662 days.

(21) Appl. No.: 12/552,675

(22) Filed: Sep. 2, 2009

(65) Prior Publication Data

US 2010/0231532 A1    Sep. 16, 2010

(30) Foreign Application Priority Data

Mar. 12, 2009  (KR) ........................ 10-2009-0020995

(51) Int. Cl.
*G06F 3/042*    (2006.01)

(52) U.S. Cl. .................................................... 345/176

(58) Field of Classification Search ............ 345/176
See application file for complete search history.

(56) References Cited

U.S. PATENT DOCUMENTS

| | | |
|---|---|---|
| 4,558,313 A | 12/1985 | Garwin et al. |
| 5,196,835 A | 3/1993 | Blue et al. |
| 6,008,798 A | 12/1999 | Mato, Jr. et al. |
| 6,480,187 B1 * | 11/2002 | Sano et al. ..................... 345/175 |
| 2008/0011944 A1 | 1/2008 | Chua et al. |
| 2008/0180654 A1 * | 7/2008 | Bathiche et al. ................ 356/51 |

FOREIGN PATENT DOCUMENTS

KR    1020070054607 A    5/2007

OTHER PUBLICATIONS

Extended European Search Report issued on Mar. 30, 2010 in counterpart European Application No. 09169768.0.

* cited by examiner

*Primary Examiner* — Adam R Giesy
(74) *Attorney, Agent, or Firm* — Sughrue Mion, PLLC

(57) ABSTRACT

A touch sensing system which senses a touch position on a screen, including a light source to emit light; a light deflection unit to deflect the light emitted from the light source, a light guide plate which is arranged opposite to the screen and guides the light deflected by the light deflection unit to different positions on the screen according to an incident position, a light detector to receive at least part of the light reflected in a touch position on the screen, and a controller to calculate the touch position on the screen based on a point of time when the light detector detects the light.

14 Claims, 6 Drawing Sheets

TOUCH SENSING SYSTEM AND DISPLAY APPARATUS EMPLOYING THE SAME

CROSS-REFERENCE TO RELATED APPLICATION

This application claims priority from Korean Patent Application No. 10-2009-0020995, filed on Mar. 12, 2009 in the Korean Intellectual Property Office, the disclosure of which is incorporated herein by reference.

BACKGROUND OF INVENTION

1. Field of Invention

Apparatuses and methods consistent with the present invention relate to a touch sensing system which can sense a plurality of touch positions on a screen which are simultaneously touched, and a display apparatus employing the same.

2. Description of Related Art

A display apparatus which can interactively communicate information has been developed. For example, a display apparatus for employing a screen of a touch type is disclosed.

FIG. 1 is a schematic view illustrating a touch sensing system for use in a conventional display apparatus.

Referring to FIG. 1, the conventional touch sensing system includes a light source 11 which is arranged adjacent to a side face of a screen 13, a reflecting member 15 which converts a traveling path of light reflected in a touch position, and a camera 17 which senses the touch position on the screen 13. The screen 13 is arranged adjacent to a display panel 1, on which an image generated in the display panel 1 is focused. The light source 11 emits light to the inside of the screen 13 through the side face of the screen 13. The light emitted from the light source 11 is totally reflected inside the screen 13 and forwardly travels.

In the case that the outside of the screen is touched, refractive indexes of the inside and outside of the screen 13 become different from each other in the touch position, and thus, the traveling path of the light emitted from the light source 11 is changed. The camera 17 recognizes the touch position from the light which is reflected in the touch position and the path of which is converted by the reflecting member 15.

The above-described conventional touch sensing system includes the reflecting member and the camera behind the display panel as shown in FIG. 1, thereby requiring a wide space for installation thereof. Accordingly, there is a limit to reducing overall thickness of the display apparatus. Further, the camera is used for recognizing the touch position, thereby increasing manufacturing cost thereof.

SUMMARY OF INVENTION

Accordingly, it is an aspect of the present invention to provide a touch sensing system which can exactly sense a plurality of touch positions on a screen which are simultaneously touched and which can reduce overall thickness of a display apparatus, and the display apparatus employing the same.

The foregoing and/or other aspects of the present invention can be achieved by providing a touch sensing system which senses a touch position on a screen, including: a light source to emit light; a light deflection unit to deflect the light emitted from the light source; a light guide plate which is arranged opposite to the screen and guides the light deflected by the light deflection unit to direct to different positions on the screen according to an incident position; a light detector to receive at least part of the light reflected in a touch position on the screen; and a controller to calculate the touch position on the screen based on a point of time when the light detector detects the light.

According to aspects of the present invention, the light guide plate includes: a light exit part to transmit the incident light towards the screen; a side face part into which the light deflected by the light deflection unit is incident; and an incidence and reflection part which is inclinedly formed with respect to the light exit part and transmits an incident image towards the light exit part and reflects the light which is deflected by the light deflection unit and incident into the side face part to direct to the different positions on the screen according to the incident position.

According to aspects of the present invention, the light deflection unit includes a two-axes driving scanner which scans the light emitted from the light source to the side face part of the light guide plate in a main scan direction and a sub scan direction to form a 2-dimensional scan line.

According to aspects of the present invention, the light deflection unit includes: a first light deflection unit which scans the light emitted from the light source in the sub scan direction; and a second light deflection unit which is arranged between the first light deflection unit and the side face part of the light guide plate and scans the incident light in the main scan direction.

According to aspects of the present invention, each of the first and second light deflection units includes at least one of a polygonal rotating mirror, a microelectromechanical system (MEMS) scanner and a Galvano-Mirror.

According to aspects of the present invention, the apparatus may include a synchronization signal detecting sensor to detect a leading edge of a synchronization signal of the light deflected in the light deflection unit.

According to aspects of the present invention, the controller calculates the information on the touch position on the screen based on time difference between a point of time when the synchronization detecting sensor detects the leading edge of the synchronization signal and a point of time when the light detector detects the light.

According to aspects of the present invention, the light source includes at least one of a laser diode to emit invisible light and a light emitting diode.

The foregoing and/or other aspects of the present invention are achieved by providing a display apparatus including: a screen to display an image and receive information on a touch position; a touch sensing system according to the above mentioned touch sensing system which senses the touch position on the screen; and a display panel which provides an image for the screen.

Additional aspects of the present invention will be set forth in part in the description which follows and, in part, will be obvious from the description, or may be learned by practice of the present invention.

BRIEF DESCRIPTION OF DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS

Figure 1:
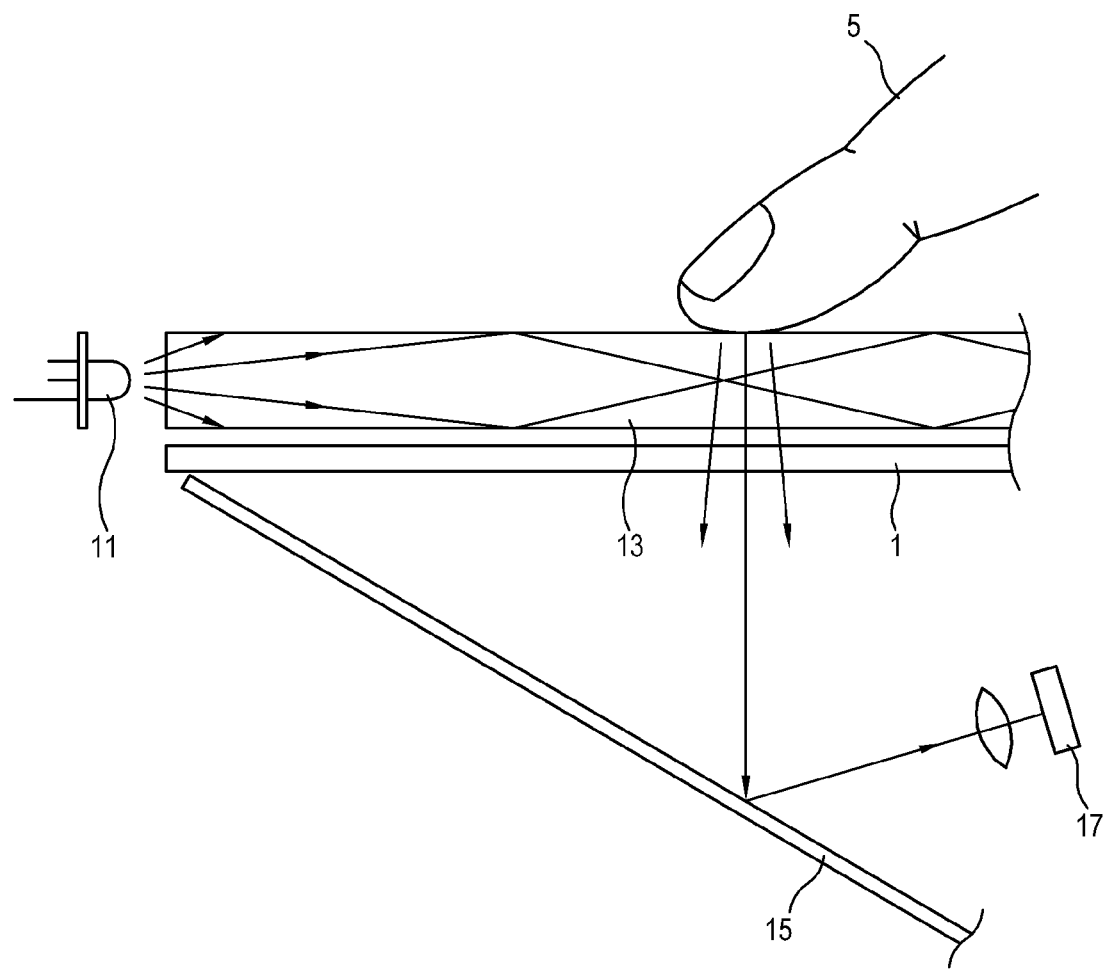
FIG. 1 is a schematic view illustrating a conventional touch sensing system.

Reference will now be made in detail to exemplary embodiments of the present invention, examples of which are illustrated in the accompanying drawings, wherein like reference numerals refer to like elements throughout. The exemplary embodiments are described below so as to explain the present invention by referring to the figures. Redundant description to different embodiments may be omitted as necessary.

Figure 2:
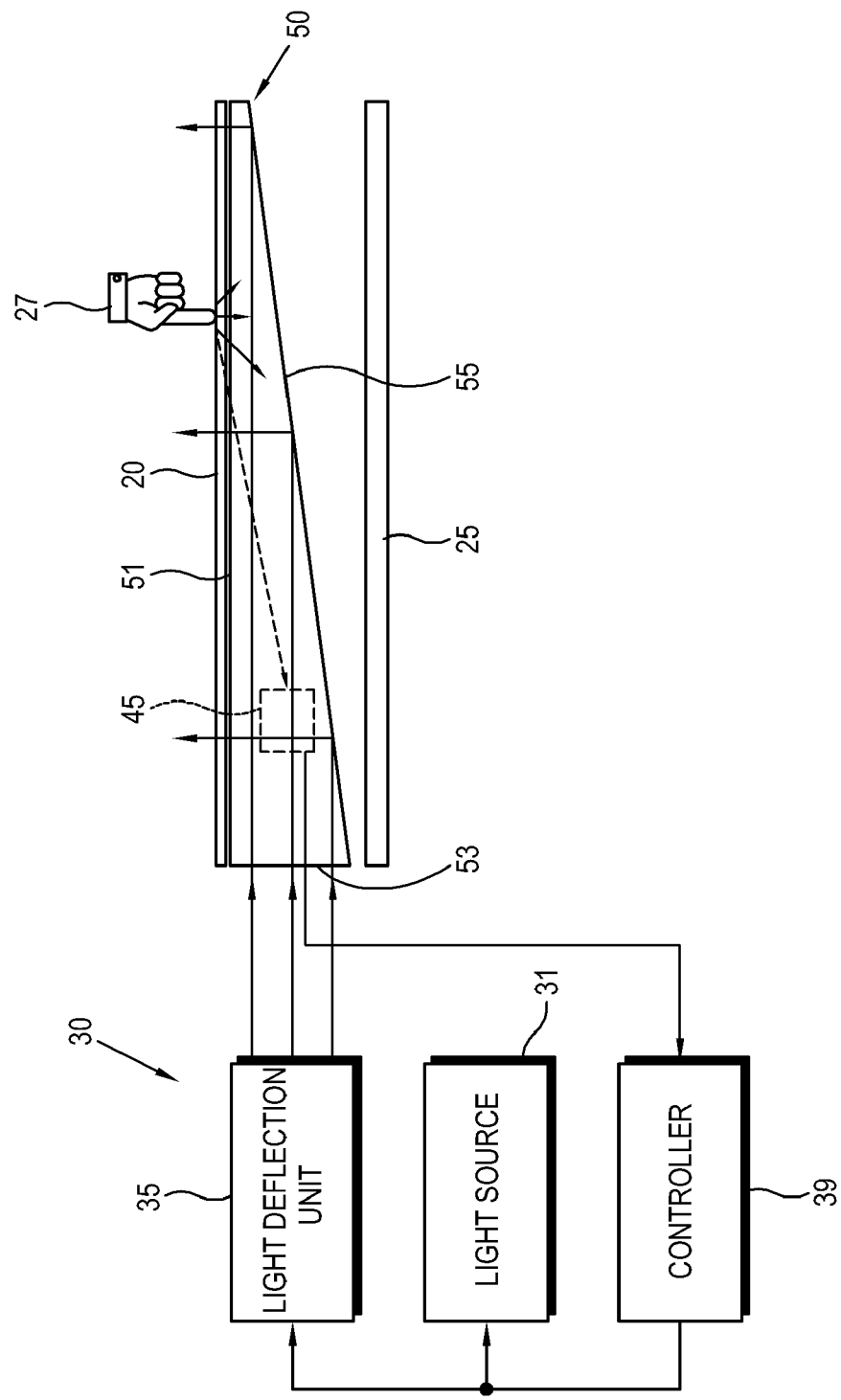
FIG. 2 is a schematic view illustrating a touch sensing system according to an exemplary embodiment of the present invention.
Figure 3:
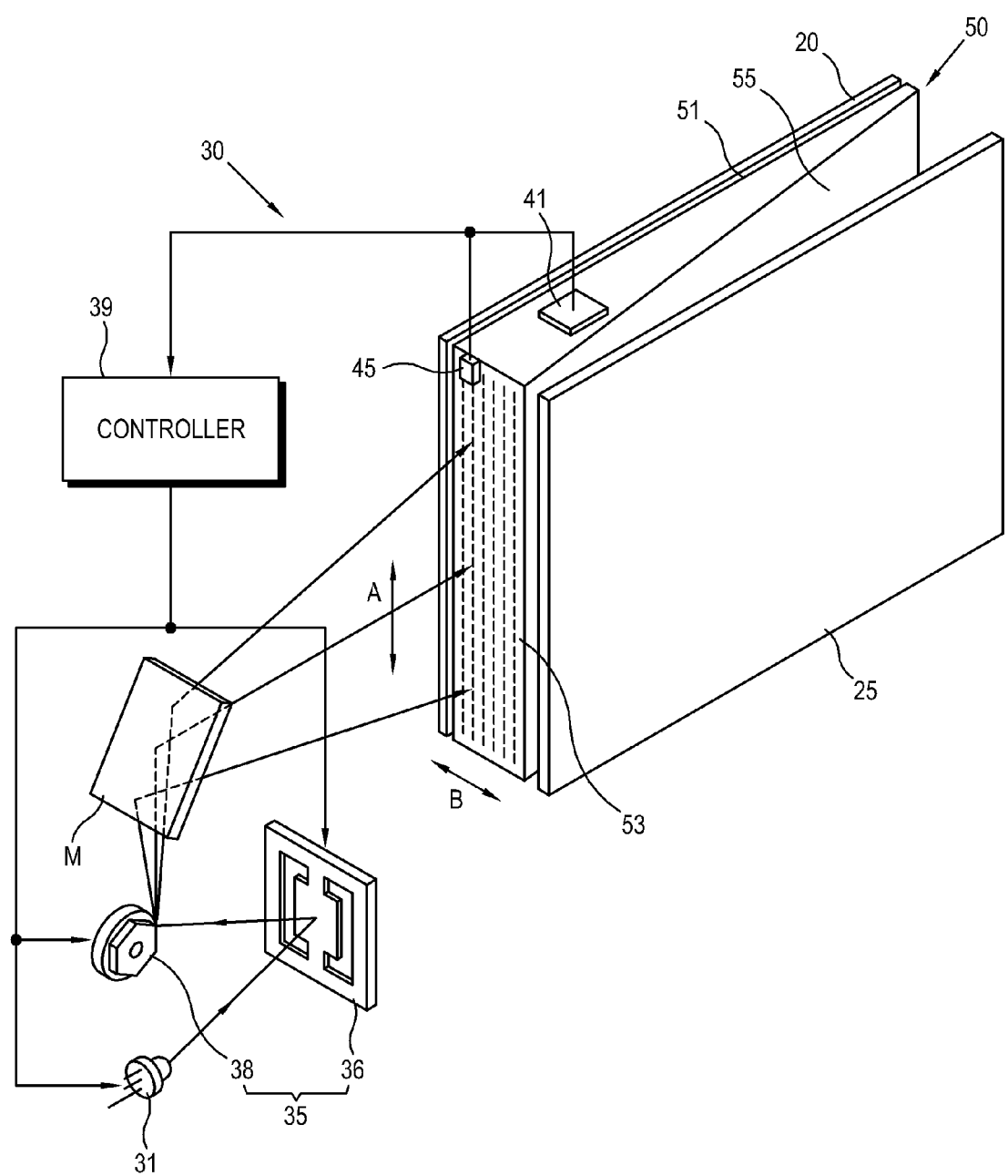
FIG. 3 is a schematic perspective view illustrating a touch sensing system according to an exemplary embodiment of the present invention.

FIG. 2 is a schematic view illustrating a touch sensing system according to an exemplary embodiment of the present invention; and FIG. 3 is a schematic perspective view illustrating a touch sensing system according to an exemplary embodiment of the present invention.

Referring to FIGS. 2 and 3, a touch sensing system 30 according to an exemplary embodiment of the present invention senses at least one touch position on a screen 20. The touch sensing system 30 includes a light source 31 to emit light, a light deflection unit 35 to deflect the light, a light guide plate 50, a light detector 41 to receive the light reflected from the touch position on the screen 20, and a controller 39.

The light source 31 emits light for sensing the at least one touch position and is arranged adjacent to at least one side of the light guide plate 50. The light source 31 may include at least one of a laser diode which emits light having a predetermined wavelength and a light emitting diode (LED). The light source 31 may emit an invisible light such as infrared rays. Accordingly, the light source 31 may not have influence on an image which is generated in a display panel 25 and transmitted through the light guide plate 50.

A light deflection unit 35 deflects the light emitted from the light source 31 in a main scan direction A and a sub scan direction B. Accordingly, the light emitted from the light source 31 is sequentially scanned throughout the screen 20.

To this end, the light deflection unit 35 may include a first light deflection unit 36 and a second light deflection unit 38. Referring to FIG. 3, the first light deflection unit 36 scans the light emitted from the light source 31 in the sub scan direction B. The second light deflection unit 38 is arranged between the first light deflection unit 36 and a side face part 53 of the light guide plate 50 and scans the light in the main scan direction A. Here, the main scan direction refers to a width direction of the light guide plate 50 as indicated by an arrow A in FIG. 3 and the sub scan direction refers to a height direction of the light guide plate 50 as indicated by an arrow B in FIG. 3.

The light deflection unit 35 may form a 2-dimensional scan line on the side face part 53 of the light guide plate 50 using the first light deflection unit 36 and the second light deflection unit 38.

Each of the first deflection unit 36 and the second light deflection unit 38 may be embodied as at least one of a polygonal rotating mirror, a microelectromechanical system (MEMS) scanner and a Galvano-Mirror. For example, as shown in FIG. 3, the first light deflection unit 36 may be provided as a 1-dimensional MEMS scanner which is reciprocally rotated by an electrostatic force and an elastic restoring force and the second light deflection unit 38 may be provided as the polygonal rotating mirror which is rotatably driven by a motor to form a scan line. Further, the light deflection unit 35 may further include a reflecting member M which changes a traveling path of the light deflected by the second light deflection unit 38 to direct towards the side face part 53 of the light guide plate 50.

Figure 4:
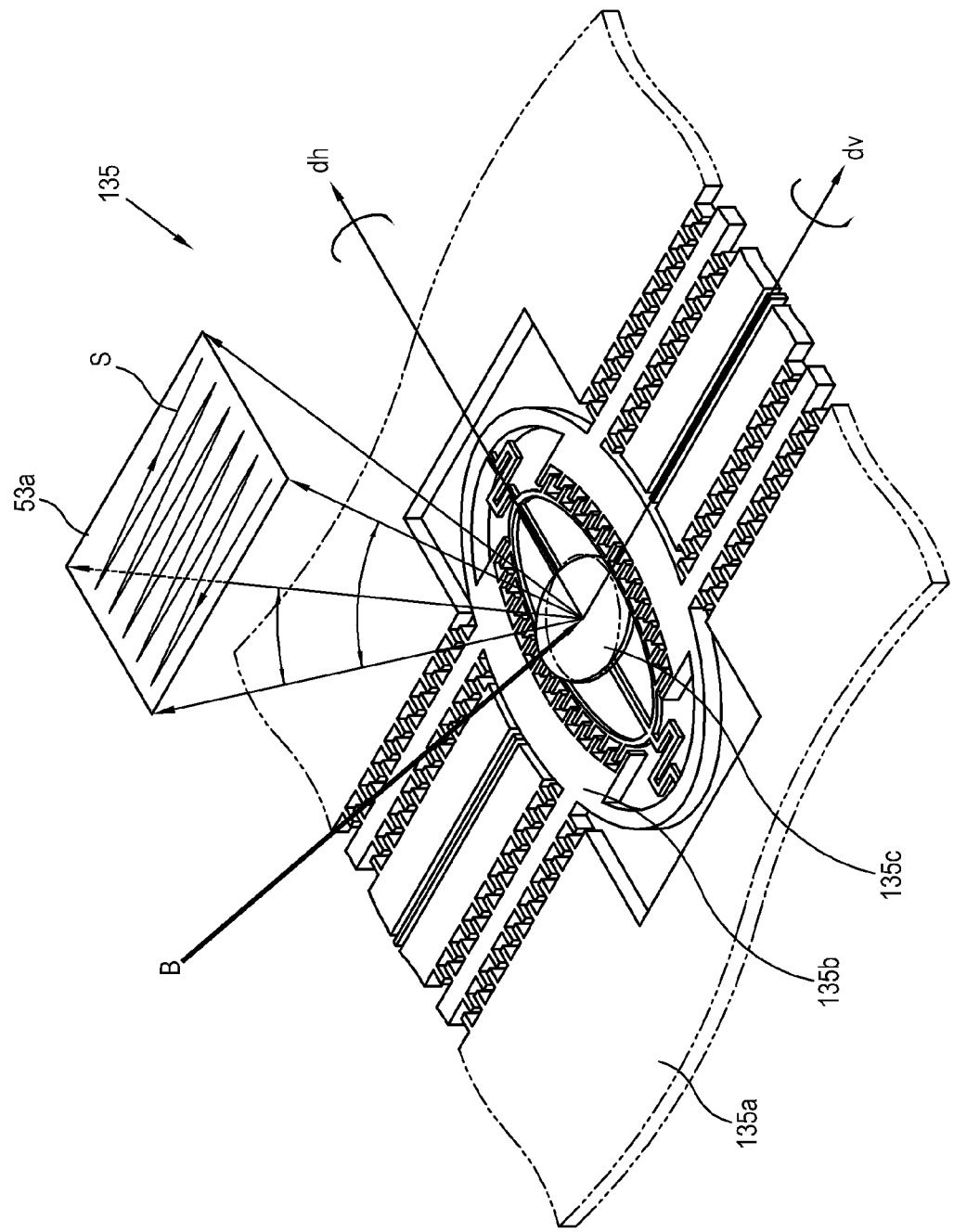
FIG. 4 is a perspective view illustrating a two-axes driving scanner in a touch sensing system according to an exemplary embodiment of the present invention.

Further, the light deflection unit 35 may include a two-axes driving scanner 135 as shown in FIG. 4.

Referring to FIG. 4, the two-axes driving scanner 135 includes a base 135a, an operating plate 135b which is installed to be driven in a vertical direction dv with respect to the base 135a, and a scanning mirror 135c which is installed to be driven in a horizontal direction dh with respect to the operating plate 135b and scans incident light along a scan line S in a two-axes way.

Here, opposite end parts of the operating plate 135b are connected to the base 135a by a torsion spring so that the operating plate 135b is vertically driven with respect to the base 135a. Further, a first comb-electrode element is provided in the base 135a and the operating plate 135b. Accordingly, the operating plate 135b may be driven by an electrostatic force of the first comb-electrode element and an restoring force of the torsion spring.

Further, opposite end parts of the scanning mirror 135c are connected to the operating plate 135b by a resonance spring so that the scanning mirror 135c is horizontally driven with respect to the operating plate 135b. Furthermore, a second comb-electrode element is provided in the operating plate 135b and the scanning mirror 135c. Accordingly, the scanning mirror 135c may be horizontally driven by an electrostatic force of the second comb electrode element and a restoring force of the resonance spring.

As described above, the two-axes driving scanner 135 is provided as the light deflection unit, thereby forming a scan line on a 2-dimensional plane with respect to the side face of the light guide plate 50 with the lapse of time.

Figure 5:
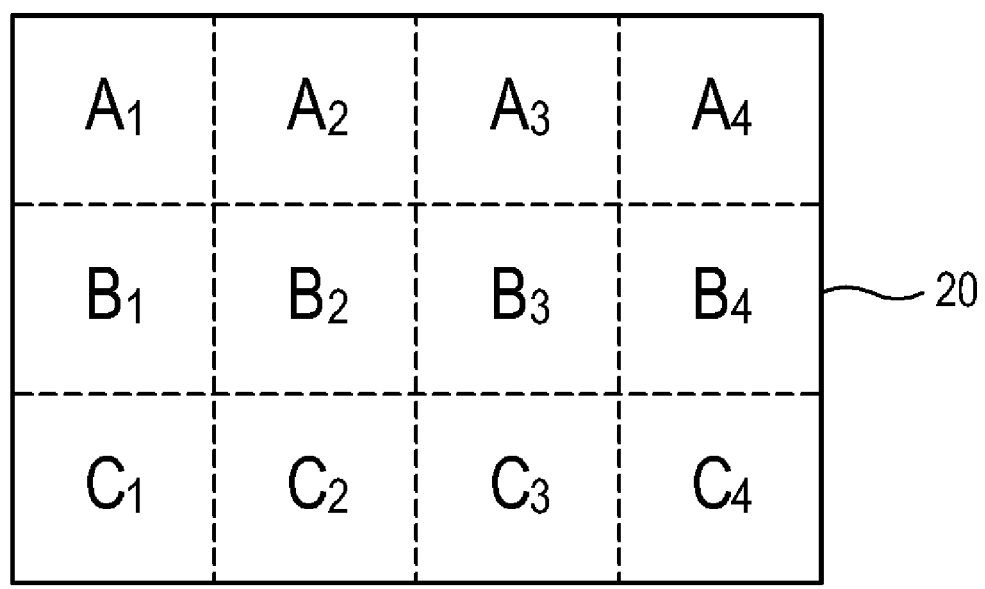
FIG. 5 is a diagram illustrating a screen in a display apparatus employing a touch sensing system according to an exemplary embodiment of the present invention.
Figure 6:
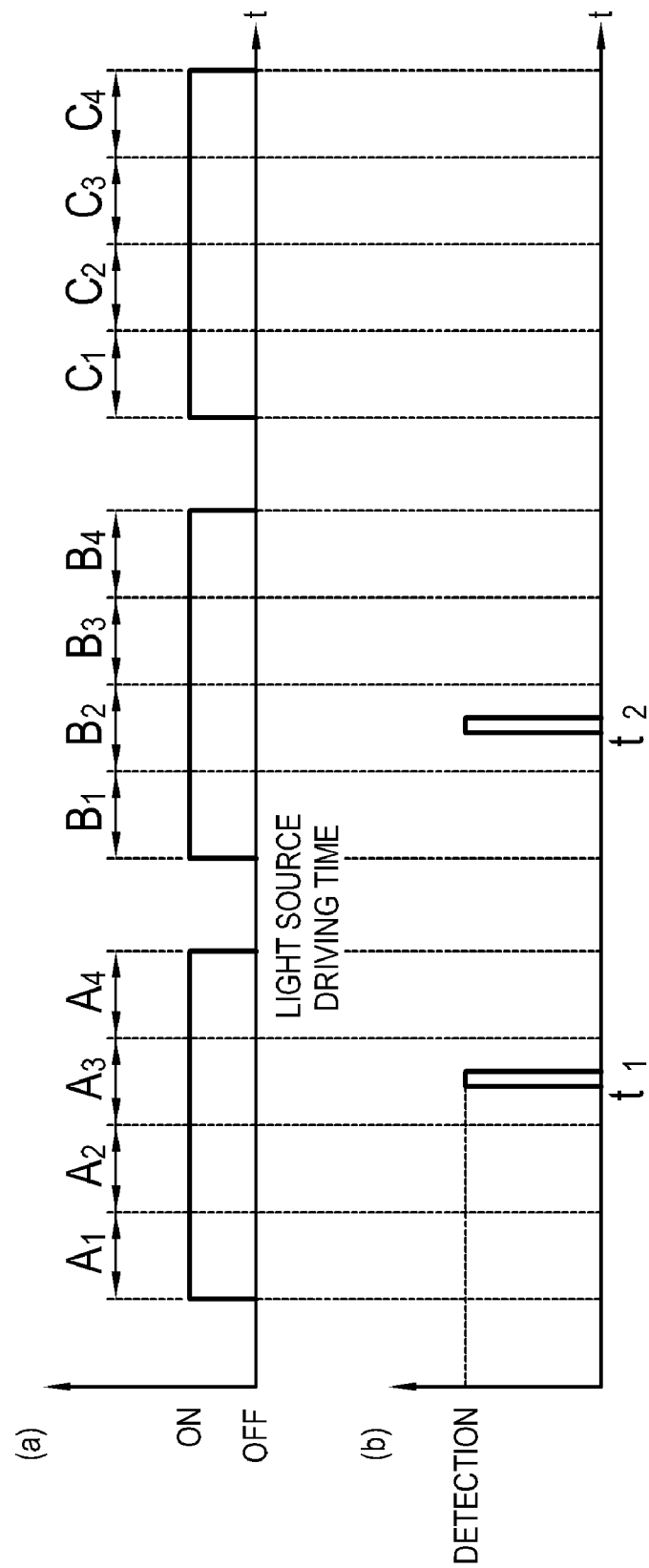
FIG. 6 is a graph schematically illustrating a point of time when a light source is driven and a point of time when a light detector detects light in the case that A3 and B2 areas are simultaneously touched.

The light guide plate 50 is arranged adjacent to a rear face of the screen 20 and guides the 2-dimensional scan line deflected by the light deflection unit 35 to direct to a different position on the screen 20 depending on the incident position thereof. To this end, the light guide plate 50 includes a light exit part 51, the side face part 53 into which the light deflected by the light deflection unit 35 is incident, and an incidence and reflection part 55. The light exit part 51 is a surface opposite to the screen 20 and transmits the incident light towards the screen 20. Further, in the case that a user touches a predetermined position on the screen by a finger, the light exit part 51 re-reflects the light exited to the touch position. The incidence and reflection part 55 is inclinedly formed with respect to the light exit part 51. The incidence and reflection part 55 transmits an image which is incident from the display panel 25 towards the light exit part 51 and reflects the light which is deflected by the light deflection unit 35 and incident into the side face part 53 towards the screen 20. In this respect, the light which is incident into the incidence and reflection part 55 through the side face part 53 is directed to different positions on the screen 20 according to a position of the scan line. For example, as shown in FIG. 5, in the case that the screen 20 is divided into 3×4 areas for simplicity of description, a scan line which is incident into the side face part 53 has a different light exit area according to a position of the sub scan direction B. That is, a scan line which is incident into the lowest part of the side face part 53 is exited towards A1, B1 and C1 areas; and a scan line which is incident into the highest part of the side face part 53 is exited to A4, B4 and C4 areas.

The light detector 41 is installed adjacent to the light guide plate 50 and receives at least part of the light reflected in a touch position on the screen 20. That is, in the case that at least an area on the screen 20 is touched, light which exits through the light exit part 51 towards the touch position is diffusely reflected; and part of the diffused light is received by the light detector 41.

The controller 39 calculates the touch position on the screen 20 based on a point of time when the light detector 41 detects the light. That is, the light emitted from the light source 31 is scanned throughout the screen 20 by the light deflection unit 35 with a time difference. Accordingly, the controller 39 may calculate the touch position based on a specific point of time when the light detector 41 detects the light and a point of time when the light is scanned. In particular, in the case that a plurality of touch positions on the screen is simultaneously touched, each touch position can be exactly detected in the same way.

For example, as shown in FIG. 5, in the case that the light is scanned with respect to the screen having the 12 areas, the light source 31 is driven in A1 to A4 areas, B1 to B4 areas and C1 to C4 areas, and is not driven in the other areas. In the case that the A3 area and B2 area are simultaneously touched, the light detector 41 receives the light in points of time t1 and t2. Here, each of the points of time t1 and t2 corresponds to driving time of the light source for scanning the light with respect to the A3 area and B2 area, thereby exactly calculating the touch position therefrom.

The touch sensing system 30 may further include a synchronization signal detecting sensor 45 which detects a leading edge of a synchronization signal of the light deflected by the light deflected unit 35 to reduce an error in calculating the touch position by the controller 39.

In this case, the controller 39 may calculate the touch position on the screen based on a time difference between a point of time when the synchronization detecting sensor 45 detects the leading edge of the synchronization signal and a point of time when the light detector detects the light.

In the present embodiment, the touch sensing system is applied to the display apparatus as an example. However, the present invention is not limited thereto, and accordingly, the touch sensing system may be applied to various electronic devices without the display panel.

Further, the touch sensing system according to the present invention can sense a touch position using a wedge shaped light guide plate and a 2-dimensional light deflection unit, thereby exactly recognizing a plurality of touch positions on a screen. In addition, an optical element such as a camera is not arranged in rear of the display panel, thereby acquiring a thin display apparatus.

Furthermore, a display apparatus according to an exemplary embodiment of the present invention includes the screen 20 which receives information on a touch position, the touch sensing system 30 which senses at least a touch position on the screen 20 and the display panel 25 which provides an image with the respect to the screen 20. In this respect, the touch sensing system 30 has the above-described configuration and function.

As described above, the touch sensing system according to the present invention senses the touch position using the wedge shaped light guide plate and the 2-dimensional light deflection unit, thereby exactly recognizing a plurality of the touch positions on the screen. Further, an optical element is not arranged in rear of the display panel, thereby acquiring a thin display apparatus.

Further, the touch sensing system according to the present invention employs a light detector which receives light in a point of time when the touch position is sensed, thereby simplifying its configuration compared with the conventional touch sensing system employing a camera and reducing the manufacturing cost thereof.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A touch sensing system which senses a touch position on a screen, comprising:
    a light source that emits light;
    a light deflection unit that deflects the light emitted from the light source;
    a light guide plate which is arranged opposite to the screen and which guides the light deflected by the light deflection unit to different positions on the screen according to an incident position of the deflected light and transmits an image entered from a display panel on the screen;
    a light detector that receives at least part of the guided light that is reflected from the touch position on the screen;
    a controller that calculates the touch position on the screen based on a point of time when the light detector detects the light; and
    a synchronization signal detecting sensor that detects a leading edge of a synchronization signal of the light deflected in the light deflection unit.

2. The touch sensing system according to claim 1, wherein the light guide plate comprises:
    a light exit part that transmits the incident light towards the screen;
    a side face part into which the light deflected by the light deflection unit is incident; and
    an incidence and reflection part which is inclinedly formed with respect to the light exit part and which transmits an incident image towards the light exit part and which reflects the light which is deflected by the light deflection unit and incident into the side face part to the different positions on the screen according to the incident position of the deflected light.

3. The touch sensing system according to claim 2, wherein the light deflection unit comprises a two-axes driving scanner which scans the light emitted from the light source to the side face part of the light guide plate in a main scan direction and a sub scan direction to form a 2-dimensional scan line.

4. The touch sensing system according to claim 2, wherein the light deflection unit comprises:
    a first light deflection unit which scans the light emitted from the light source in a sub scan direction; and
    a second light deflection unit which is arranged between the first light deflection unit and the side face part of the light guide plate and which scans the incident light in a main scan direction.

5. The touch sensing system according to claim 4, wherein each of the first and second light deflection units comprises at least one of a polygonal rotating mirror, a microelectromechanical system (MEMS) scanner and a Galvano-Mirror.

6. The touch sensing system according to claim 1, wherein the controller calculates the information on the touch position on the screen based on a time difference between a point of time when the synchronization detecting sensor detects the leading edge of the synchronization signal and a point of time when the light detector detects the light.

7. The touch sensing system according to claim 1, wherein the light source comprises at least one of a laser diode that emits invisible light and a light emitting diode.

8. A display apparatus comprising:
a screen to display an image and receive information on a touch position;
a display panel which provides an image for the screen; and
a touch sensing system which senses the touch position on the screen, wherein the touch sensing system comprises:
a light source that emits light;
a light deflection unit that deflects the light emitted from the light source;
a light guide plate which is arranged opposite to the screen and which guides the light deflected by the light deflection unit to different positions on the screen according to an incident position of the deflected light and transmits an image entered from the display panel on the screen;
a light detector that receives at least part of the guided light that is reflected from the touch position on the screen;
a controller that calculates the touch position on the screen based on a point of time when the light detector detects the light; and
a synchronization signal detecting sensor that detects a leading edge of a synchronization signal of the light deflected in the light deflection unit.

9. The display apparatus according to claim 8, wherein the light guide plate comprises:
a light exit part that transmits the incident light towards the screen;
a side face part into which the light deflected by the light deflection unit is incident; and
an incidence and reflection part which is inclinedly formed with respect to the light exit part and which transmits an incident image towards the light exit part and which reflects the light which is deflected by the light deflection unit and incident into the side face part to the different positions on the screen according to the incident position of the deflected light.

10. The display apparatus according to claim 9, wherein the light deflection unit comprises a two-axes driving scanner which scans the light emitted from the light source to the side face part of the light guide plate in a main scan direction and a sub scan direction to form a 2-dimensional scan line.

11. The display apparatus according to claim 9, wherein the light deflection unit comprises:
a first light deflection unit which scans the light emitted from the light source in a sub scan direction; and
a second light deflection unit which is arranged between the first light deflection unit and the side face part of the light guide plate and which scans the incident light in a main scan direction.

12. The display apparatus according to claim 11, wherein each of the first and second light deflection units comprises at least one of a polygonal rotating mirror, a microelectromechanical system (MEMS) scanner and a Galvano-Mirror.

13. The display apparatus according to claim 8, wherein the controller calculates the information on the touch position on the screen based on a time difference between a point of time when the synchronization detecting sensor detects the leading edge of the synchronization signal and a point of time when the light detector detects the light.

14. The display apparatus according to claim 8, wherein the light source comprises at least one of a laser diode that emits invisible light and a light emitting diode.

* * * * *